United States Patent [19]
Bergmann et al.

[11] 4,317,104
[45] Feb. 23, 1982

[54] PRECISION RESISTOR FOR MEASUREMENT PURPOSES

[75] Inventors: Eduard Bergmann; Wolfgang Bonczek, both of Ludenscheid, Fed. Rep. of Germany

[73] Assignee: Firma Leopold Kostal, Ludenscheid, Fed. Rep. of Germany

[21] Appl. No.: 91,894

[22] Filed: Nov. 7, 1979

[30] Foreign Application Priority Data

Feb. 5, 1979 [DE] Fed. Rep. of Germany ....... 2904197

[51] Int. Cl.³ .............................................. H01C 1/144
[52] U.S. Cl. .................................... 338/330; 338/290; 338/310; 338/312; 338/324; 338/329; 338/333
[58] Field of Search .................... 338/283, 287–289, 338/279, 290, 310, 312, 329, 330, 322–325, 327, 333, 334; 361/400, 404, 405, 305, 306; 29/610

[56] References Cited

U.S. PATENT DOCUMENTS

| | | | |
|---|---|---|---|
| 2,019,457 | 10/1935 | Lodge | 338/329 X |
| 2,883,502 | 4/1959 | Rudner | 338/330 |
| 2,956,696 | 8/1961 | Harman | 338/327 X |
| 3,496,513 | 2/1970 | Hekeland | 338/329 X |
| 3,964,943 | 6/1976 | Anderson | 338/322 X |

FOREIGN PATENT DOCUMENTS 2397705  3/1979  France ............................. 338/279

*Primary Examiner*—C. L. Albritton
*Attorney, Agent, or Firm*—Schwartz, Jeffery, Schwaab, Mack, Blumenthal & Koch

[57] ABSTRACT

A precision resistor for use in electrical circuits arranged on printed circuit boards is produced from a band of thermally conductive alloy. The band is selectively surface treated with a conductive coating to improve solderability in the region of the resistor where it is connected to conductors of the circuit board.

6 Claims, 5 Drawing Figures

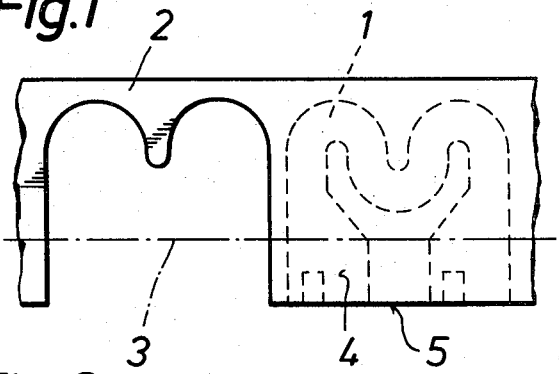
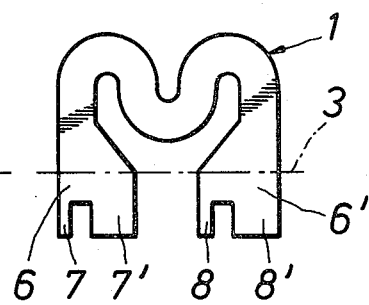
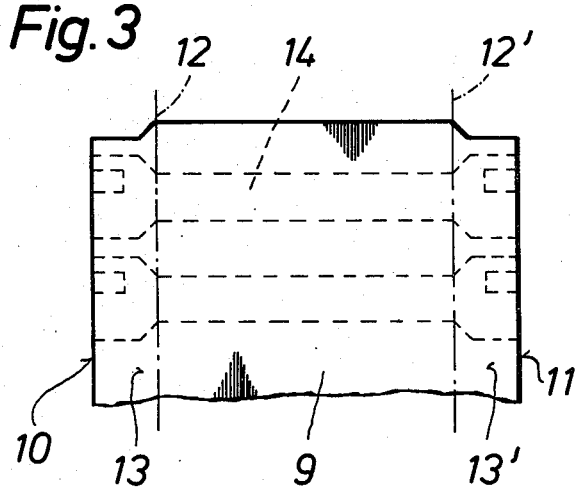
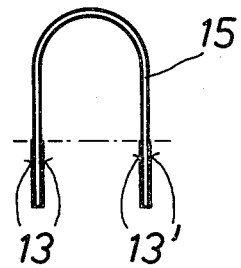
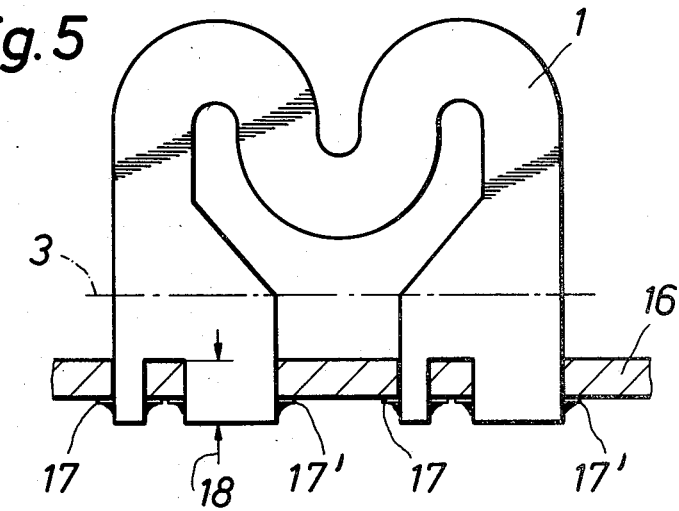

PRECISION RESISTOR FOR MEASUREMENT PURPOSES

BACKGROUND OF THE INVENTION

The invention relates to a precision resistor for measuring purposes in electrical circuits arranged on printed circuit boards.

Known precision resistors for the above-mentioned field of application are made of a thermally conductive alloy and formed into strips. Solderable wire terminals or narrow metal strips are secured by means of spot welding to both ends of the resistor strips to serve as connecting pins for fastening them to the circuit board and effecting their connection with the conductors of the board.

The resistor itself may be from a semifinished material and may be made as a stamped metal part having comparatively close resistance value tolerances. The weld joints, however, cannot be achieved with the accuracy required, thus resulting in unacceptable variances of the tolerances, thereby requiring in some form a fine tuning of the resistor. While the welding process is time consuming and expensive, the additional tuning process is even more so.

SUMMARY OF THE INVENTION

It is an object of the invention to provide a precision resistor capable of being manufactured by a simple process and of satisfying tolerance specifications without subsequent operations. This objective is attained according to the invention by producing the resistor in a single piece by stamping from a thermally conductive alloy band, selectively surface treated in strips so as to improve the solderability of the resistor to the conductors of the printed circuit board, with the soldering steps being per se known.

Since the one-piece design includes the connecting terminals of the resistor, the welding of separate connecting elements is eliminated. The accuracy attained by the stamping process with respect to the resistance value is within the tolerances required. Also, the process of selective surface treatment in stripes is at such a technical level, particularly with respect to the width of the selective application of the coating in relation to the resistance value, that tolerance specifications are satisfied and secondary operations eliminated.

For a resistor formed as a flat stamped part, both surfaces of one longitudinal edge of the band are surface-treated in strips such that the part to be stamped out may be stamped from the band with the feet of the precision resistor within the surface-treated areas of the band. In a modification wherein both sides of both longitudinal edges of the band are subjected to selective surface treatment, either two resistors facing each other at 180° in the band may be punched out simultaneously, or a strip resistor can be formed and, subsequent to the punching process, bent in the shape of a U, for example, by a forming tool.

In a further design feature of the resistor, feet having two toes each are provided, which affords the advantage that the resistor is able to separately contact, for example, current carrying conductors and conductors leading to the measuring circuit, whereby the contact resistance through the soldered joint with the current carrying conductors does not effect the measurement. If desired, one toe of each foot can be made wider than the other. The wider toe is soldered into the circuit carrying the higher current, for example a lamp current circuit, while the narrower toe is made to contact the measuring current circuit.

The strips or areas of surface treatment of the precision resistor extend over the area on the foot which is inserted into openings in the circuit board so that the lowest possible contact resistance is obtained in the soldered joint, thus keeping the generation of heat within permissible limits. Therefore, in the case of an overload, the soldered joints themselves and also the circuit board are protected against destruction by overheating.

A further embodiment of the precision resistor is designed so as to be favorably adapted to given space conditions. In this embodiment, the strip resistor is bent in a U-shape such that it requires more space in the direction of the width as compared with a flat resistor, but less in the longitudinal direction.

With regard to the surface treatment of the semi-finished resistor material, when the stamped-out resistors are stored under hermetic seal or when a suitable fluxing agent is used in the soldering process, a copper coating may be adequate. By means of subsequent tinning, solder-ability may be further improved, and the above described expensive storage mode may be eliminated. A precious metal coating also favors solderability.

BRIEF DESCRIPTION OF THE APPLICATION DRAWINGS

The invention will be explained in more detail with particular reference to the application drawings, wherein:

FIG. 1 is a top plan view of a section of the band of resistor material to be stamped, with the outline of the precision resistor indicated in dashed lines;

FIG. 2 shows a stamped-out flat resistor;

FIG. 3 is a top plan view of a section of a band to be stamped, showing a different form of precision resistor, with the outline of two such resistors being indicated in dashed lines;

FIG. 4 is a side elevation of a precison resistor of the form shown in FIG. 3, bent in the shape of a U; and FIG. 5 is a fragmentary sectional view through a circuit board, with the precison resistor of FIG. 2 shown soldered in the board.

DETAILED DESCRIPTION OF THE PREFERRED EMBODIMENTS

The flat precision resistor 1 according to FIG. 2 is stamped or punched out of section 2 of the band of resistor material shown in FIG. 1. The dashed-dot line 3 and edge 5 of the band define the boundaries of the selective surface treatment area 4, which is preferably effected on both sides of the band. The precision resistor 1 has two feet 6, 6', each being provided with two toes 7, 7'or 8, 8', respectively. The area 4 of the band of resistor material can be surface treated with a copper coating which may, if desired, have a tin overlay. A precious metal may also be used for the coating.

FIG. 3 shows a section 9 of a band of resistor material to be stamped, with both longitudinal edges 13, 13' adjacent the band edges 10, 11 being surface treated in strips on both faces of the band, the boundaries of the surface-treated zones 13, 13' being indicated by the dashed-dot line 12, 12'. The positions and outlines of the resistors 14 of the FIG. 3 form are shown in broken lines. It can be seen that two separate resistors 14 may be simultaneously stamped out of section 9 of the band of resistor material shown in FIG. 3 by a suitable stamping tool in a single stroke, the resistors 14 facing each other offset by 180°.

A stamped precision resistor 15 is shown in side elevation in FIG. 4, with the resistor in this form being stamped or punched out as shown in FIG. 3 and bent into the shape of a U and thus ready for installation in a circuit board. Although the resistor 15 has somewhat greater depth, it is considerably shorter in a longitudinal direction than the flat resistor 1 of FIG. 2. The surface-treated zones 13, 13' are also seen in FIG. 4.

Referring to FIG. 5, the resistor 1 of FIG. 2 is shown mounted in a circuit board 16, with the resistor being shown soldered to conductors 17, 17'. It will be noted that the surface-treated zones of the resistor, bounded by the dash-dot line 3 and the bottom edges of the feet of the resistor, extends well past the portion of the feet inserted in the openings of the board, such portion being shown by reference numeral 18.

We claim:

1. A precision resistor for use in electrical circuits arranged on printed circuit boards, said resistor comprising a single piece produced by punching or stamping said resistor from a flat band of thermally conductive alloy selectively surface treated with a conductive coating in confined areas on said resistor so as to improve solderability of the resistor to conductors of a circuit board, said resistor being formed at portions thereof which are to be mounted to said board with spaced feet by means of which the resistor can be soldered to the conductors of a circuit board, each of said feet being formed with two spaced toes; both surfaces of said resistor which encompass said feet being treated with said conductive coating.

2. The precision resistor of claim 1 wherein said resistor is bent so as to be U-shaped in cross-section.

3. The precision resistor of claim 1 wherein one toe on each foot is broader than the other, with the broader toe being soldered into a circuit carrying the higher current, while the narrow toe is adapted to contact and form part of a measuring current circuit.

4. The precision resistor of claim 1 wherein said conductive coating is in the form of a copper coating.

5. The precision resistor of claim 4 wherein a coating of tin is applied over said copper coating.

6. The precision resistor of claim 1 wherein said conductive coating comprises a precious metal.

* * * * *